(12) United States Patent
Innes et al.

(10) Patent No.: US 9,234,914 B2
(45) Date of Patent: Jan. 12, 2016

(54) APPARATUS TO VERIFY AN ELECTRICALLY SAFE WORK CONDITION

(71) Applicant: Rockwell Automation Technologies, Inc., Mayfield Heights, OH (US)

(72) Inventors: Mark Innes, Asheville, NC (US); Roger Alan Plemmons, Asheville, NC (US)

(73) Assignee: Rockwell Automation Technologies Incorporated, Mayfield Heights, OH (US)

( * ) Notice: Subject to any disclaimer, the term of this patent is extended or adjusted under 35 U.S.C. 154(b) by 280 days.

(21) Appl. No.: 13/833,984

(22) Filed: Mar. 15, 2013

(65) Prior Publication Data

US 2014/0266241 A1 Sep. 18, 2014

(51) Int. Cl.
*G01R 1/04* (2006.01)
*G01R 1/00* (2006.01)
*H02H 1/00* (2006.01)
*H02B 1/04* (2006.01)
*G01R 19/155* (2006.01)

(52) U.S. Cl.
CPC ............ *G01R 1/0408* (2013.01); *G01R 19/155* (2013.01)

(58) Field of Classification Search
CPC .............. G01R 1/00; H02H 1/00; H02B 1/04; H02B 1/26
USPC .................. 324/111, 537, 555, 500; 307/326; 361/647, 728, 736
See application file for complete search history.

(56) References Cited

U.S. PATENT DOCUMENTS

| 3,538,440 | A | 11/1970 | Galloway |
| 4,263,550 | A | 4/1981 | Schweitzer, Jr. |
| 5,903,438 | A * | 5/1999 | Deschamps et al. .......... 361/736 |
| 6,717,293 | B1 * | 4/2004 | Irvine et al. .................... 307/326 |
| 7,746,051 | B1 * | 6/2010 | Buchanan .......... G01R 19/2503 324/114 |
| 8,500,465 | B1 * | 8/2013 | Ross et al. ...................... 439/79 |

(Continued)

FOREIGN PATENT DOCUMENTS

| EP | 0590936 | A2 | 4/1994 |
| EP | 2538229 | A1 | 12/2012 |
| FR | 2977035 | A1 | 12/2012 |

(Continued)

OTHER PUBLICATIONS

Fluke Corporation, Fluke 170 Series True-rms Digital Multimeter Extended Specification, http://assets.fluke.com/datasheets/2155a.pdf, p. 1-3, Rev. A-11/2000.

*Primary Examiner* — Tung X Nguyen
*Assistant Examiner* — Neel Shah
(74) *Attorney, Agent, or Firm* — Kunzler Law Group

(57) ABSTRACT

An apparatus for electrical safety is disclosed. A system and an alternate apparatus also perform the functions of the apparatus. The apparatus includes a test point accessible from an exterior of an enclosure while the enclosure is in a closed state. The enclosure houses one or more electrical components and the closed state prevents a user from touching the one or more electrical components. The apparatus includes a test conductor connected to a point on a conductor connected to an electrical component of the one or more electrical components where the test conductor is within the enclosure. The apparatus includes an impedance connecting the test point to the test conductor. The impedance is within the enclosure. The test point meets an Ingress Protection code rating of 20.

19 Claims, 8 Drawing Sheets

(56) References Cited

U.S. PATENT DOCUMENTS

2012/0098522 A1* 4/2012 Allen, Jr. .................. 324/111
2014/0225627 A1* 8/2014 Green ................... G01R 27/22
                                                          324/601

FOREIGN PATENT DOCUMENTS

| GB | 2465831 A | 5/2010 |
| GB | 2483632 A | 3/2012 |

* cited by examiner

APPARATUS TO VERIFY AN ELECTRICALLY SAFE WORK CONDITION

BACKGROUND

1. Field

The subject matter disclosed herein relates to personnel protection from electrical hazards and more particularly relates to providing a mechanism to test electrical conditions in an electrical enclosure from the exterior.

2. Description of the Related Art

In an electrical environment, there is an occasional need to inspect or repair electrical components or systems within an enclosure. Although the electrical components may have a disconnect, electrical components within the enclosure may still represent a danger to an operator or technician of the enclosure. An operator or technician may not have access to internal components within the enclosure, and therefore, in order to mitigate risk, may wear safety equipment when opening the enclosure under some circumstances. Providing a way to verify the electrical state of components within such an enclosure without opening the enclosure may provide enhanced safety.

The National Fire Protection Association publishes ("NFPA") standard NFPA 70E, titled "Standard for Electrical Safety in the Workplace," which is a standard that governs electrical safety requirements for employees. The United States Occupational Safety and Health Administration ("OSHA") uses NFPA 70E and expects employers to comply with this standard. NFPA 70E addresses workplace electrical safety requirements and governs electrical conductors installed in buildings or other structures, conductors that connect to supplies of electricity, and other related conductors. Recently NFPA 70E has increased requirements for wearing safety equipment while accessing electrical equipment.

BRIEF SUMMARY

An apparatus for electrical safety is disclosed. A system and an alternate apparatus also perform the functions of the apparatus. The apparatus includes a test point accessible from an exterior of an enclosure while the enclosure is in a closed state. The enclosure houses one or more electrical components and the closed state prevents a user from touching the one or more electrical components. The apparatus includes a test conductor connected to a point on a conductor connected to an electrical component of the one or more electrical components where the test conductor is within the enclosure. The apparatus includes an impedance connecting the test point to the test conductor. The impedance is within the enclosure. The test point meets an Ingress Protection code rating of 20.

In one embodiment, the point on the conductor is a first point on the conductor, the test conductor is a first test conductor, and the impedance is a first impedance and the apparatus includes a second test conductor connected to a second point on the conductor, where the second test conductor is within the enclosure. In the embodiment, the apparatus includes a second impedance connecting the test point to the second test conductor, where the second impedance is within the enclosure.

In one embodiment, the first point on the conductor is a first end of the conductor and the second point on the conductor is a second end of the conductor. In another embodiment, the test point is a first test point, the electrical component is a first electrical component, and the conductor connected to the electrical component is a first conductor, and the apparatus includes a second test point accessible from the exterior of the enclosure while the enclosure is in a closed state, a third test conductor connected to a first point on a second conductor connected to a second electrical component, a third impedance connecting the second test point to the third test conductor where the third impedance is within the enclosure, a fourth test conductor connected to a second point on the second conductor, and a fourth impedance connecting the second test point to the fourth test conductor, where the fourth impedance is within the enclosure.

In a further embodiment, a first voltage measurement measured between the first point or the second point on the first conductor and the first point or the second point on the second conductor is substantially similar to a second voltage measurement measured between the first test point and the second test point. In another embodiment, the first and second test points are isolated from each other by a physical barrier. In another embodiment, the first electrical component and second electrical component are a single electrical component and the first conductor and second conductor are connected to the single electrical component.

In one embodiment, the apparatus includes a movable cover that covers the test point. In a further embodiment, the movable cover is attached to the enclosure. In another embodiment, moving the movable cover to expose the test point does not alter the Ingress Protection code rating of the test point. In another embodiment, the enclosure with the test point has a hazard risk category ("HRC") rating of 0 prior to accessing the test point and while the test point is accessed. In another embodiment, the impedance is configured to limit current through the first test point to below a maximum let-go level. In another embodiment, the impedance is characterized by more than 10 megaohms and less than 100 picofarads. In another embodiment, the electrical component is a disconnect, a load connection point, a ground, a grounding conductor, a phase conductor, or a grounded conductor. In another embodiment, the enclosure may be locked-out and/or tagged-out with a hazard risk category ("HRC") 0 protection per 2012 National Fire Protection Association ("NFPA") standard 70E.

In one embodiment, at least the impedance, a connection between the impedance and the test conductor, and areas of the test point surrounding a location on the test point accessed for testing are encapsulated by a material. In a further embodiment, the material reduces arc-fault potential of the apparatus to meet the HRC 0 protection of NFPA standard 70E.

A system for electrical safety includes an enclosure, one or more electrical components housed in the enclosure, a test point accessible from an exterior of the enclosure while the enclosure is in a closed state where the closed state prevents a user from touching the electrical components, and a test conductor connected to a point on a conductor connected to an electrical component of the one or more electrical components. The test conductor is within the enclosure. The system includes an impedance connecting the test point to the test conductor where the impedance is within the enclosure and the test point meets an Ingress Protection code rating of 20.

In one embodiment, the point on the conductor is a first point on the conductor, the test conductor is a first test conductor and the impedance is a first impedance and the system includes a second test conductor connected to a second point on the conductor where the second test conductor is within the enclosure, and a second impedance connecting the test point to the second test conductor where the second impedance is within the enclosure. In one embodiment, the test point is a first test point, the electrical component is a first electrical component, and the conductor connected to the electrical component is a first conductor, and the system includes a second test point accessible from the exterior of the enclosure while the enclosure is in a closed state, a third test conductor connected to a first point on a second conductor where the second conductor is connected to a second electrical component, a third impedance connecting the second test point to the third test conductor where the third impedance is within the enclosure, a fourth test conductor connected to a second point on the second conductor, and a fourth impedance connecting the second test point to the fourth test conductor where the fourth impedance is within the enclosure. The second test point meets an Ingress Protection code rating of 20. In another embodiment, the system includes a cover for exposing the test point. The cover has an open state and a closed state. The cover is attached to the enclosure where the cover, when in the open state, provides access to the test point, and, when in the closed state, increases the Ingress Protection code rating of the enclosure to 40.

Another apparatus for electrical safety includes two or more test points accessible from an exterior of an enclosure while the enclosure is in a closed state. The enclosure houses one or more electrical components and the closed state prevents a user from touching the electrical components. An electrical component of the one or more electrical components is an overcurrent protection device, a disconnect, a motor controller, a disconnect, a load connection point, a ground, a grounding conductor, a phase conductor, or a grounded conductor. Each test point includes a cover providing access to at least the test point when the cover is in an open state and covering the test point in a closed state and each test point is electrically isolated from another test point by a physical barrier. Each test point includes a first impedance connected to the test point, a first test conductor connected to the first impedance and to a first end of a conductor. The conductor is connected to an electrical component of the one or more electrical components housed within the enclosure and the conductor and the first test conductor are within the enclosure. Each test point includes a second impedance connected to the test point and a second test conductor connected to the second impedance and to a second end of the conductor where the second test conductor and second impedance are within the enclosure.

For the apparatus, at least the first impedance, the first test conductor, the second impedance, the second test conductor, and areas of the test point surrounding a location on the test point accessed for testing are encased by a material. The material reduces arc-fault potential of the apparatus to allow access to the test point with HRC 0 protection per NFPA standard 70E. The test point meets an Ingress Protection code rating of 20.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

Figure 1:
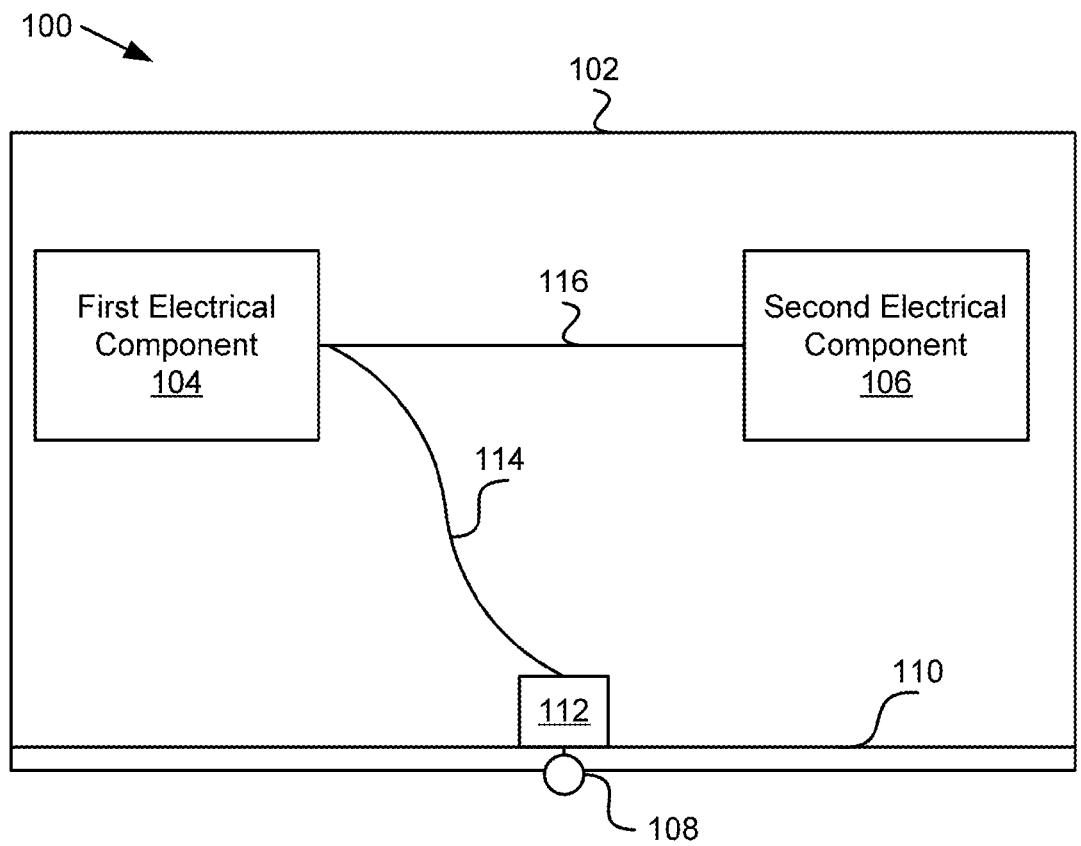
FIG. 1 is a schematic block diagram illustrating one embodiment of a system for verifying an electrically safe working condition.

FIG. 1 depicts one embodiment of system 100 with a test point for electrical equipment. The system 100 includes an enclosure 102, a first electrical component 104, a second electrical component 106, a test point 108 at a boundary 110 of the enclosure 102, an impedance 112, a test conductor 114, and a conductor 116 connecting the first electrical component 104 and the second electrical component 106, which are described below.

The system 100 includes, in one embodiment, an enclosure 102 that includes electrical components, such as the first electrical component 104 and the second electrical component 106. In one embodiment, the enclosure 102 is an electrical panel. Typically an electrical panel includes electrical components, such as circuit breakers, fuses, disconnects, bus bars, load connection points, and the like. In one example, the first electrical component 104 is a disconnect, such as a circuit breaker, and the second electrical component 106 is a load connection point.

In another embodiment, the enclosure 102 is for a disconnect. The enclosure 102 may house various electrical components such as lugs for incoming wire, bus bars, the disconnect, lugs for connecting a load, etc. In another embodiment, the enclosure 102 may house a motor controller. For example, the motor controller may be a stand-alone unit in a distributed control system with a motor starter or drive and typically includes an enclosure 102 housing the motor starter or drive. The motor controller may be configured to start a motor, stop a motor, control the speed of a motor, or the like. In another embodiment, the enclosure 102 is a motor control center. The motor control center may include various electrical components, such as motor starters, variable frequency drives, bussing for distributing power, disconnects, overcurrent protection devices, and the like.

In another embodiment, the enclosure 102 is an enclosure for switchgear. The switchgear may include electrical components such as circuit breakers, fuses, disconnects, bus bars, load connection points, etc. An enclosure 102 may include various points of entry, such as a door to expose circuit breakers, doors that open to gain access to motor starters, meters, variable frequency drives, etc. Typically the enclosure 102 houses electrical components that are an electrical hazard when energized. A test point 108 may allow a user to determine voltage conditions within the enclosure 102 prior to opening the enclosure 102. One of skill in the art will recognize other enclosures 102 with electrical components suitable for one or more test points 108.

The enclosure 102 may be made of a conductive material, such as steel or aluminum. In one embodiment, sides of the enclosure 102 may be made of different materials. For example, the sides of the enclosure 102 may be made of steel, while the door of the enclosure 102 may be made of a transparent material, such as glass, or the like, so that electrical components may be viewed while the enclosure 102 is in a closed state. In one embodiment, the enclosure 102 may be in an open state or a closed state. The closed state is typically a state where doors, covers, etc. are surrounding electrical components within the enclosure 102 to prevent a user from touching the electrical components without opening doors, removing covers, etc. The open state may allow a user to touch the electrical components. One of skill in the art will recognize other enclosures 102 that may include a test point 108.

The system 100, in one embodiment, includes a test point 108 that is accessible from an exterior of the enclosure 102 while the enclosure 102 is in a closed state. The test point 108 may be accessed for measurement of a voltage or current of an electrical component (e.g. 104) within the enclosure 102. The test point 108 may be connected to a side, top, bottom, door, etc. at a boundary 110 of the enclosure 102 such that the test point 108 is outside the enclosure 102. In another embodiment, the test point 108 may be inside the enclosure 102, however an opening in the enclosure 102 may allow access to the test point 108 from an exterior of the enclosure 102 while the enclosure 102 is in the closed state. The opening may include a cover. In one embodiment, a portion of the test point 108 is inside the enclosure 102.

In one embodiment, the test point 108 is configured to have an Ingress Protection rating of IP20. IP20 is a rating where protection of fingers against access to hazardous parts is provided as well as protection of equipment against objects larger than 12.5 millimeters ("mm"). For example, the test point 108 may be recessed in a housing of the test point 108 such that a finger or object larger than 12.5 mm will not typically be able to touch the test point 108. The housing may provide an Ingress Protection Rating of 20 by limiting the size of an aperture surrounding the test point 108. Further embodiments of such a housing are described in regard to FIG. 7.

The system 100 includes an impedance 112 connected to the test point 108. For example, the impedance 112 may include a connection to the test conductor 114 of the test point 108. The impedance 112, in one embodiment, is within the enclosure 102. In one embodiment, the impedance 112 includes one or more resistors. In another embodiment, the impedance 112 may be designed to minimize capacitance and inductance. For example, the impedance may be characterized by more than 10 megaohms of resistance, and less than 100 picofarads. The present disclosure is not limited in this regard, as one skilled in the art will recognize that other values of resistance that provide a way to measure voltage and/or current at one or more test points 108 accessible from an exterior of an enclosure 102. The impedance 112 is chosen to limit current to the test point 108 for safety and for compliance with safety standards.

In one embodiment, the impedance 112 is mounted on a substrate, such as a printed circuit board. In another embodiment, the impedance 112 is within a housing of the test point 108. In another embodiment, the impedance is isolated from the enclosure 102. In another embodiment, the impedance is arranged to prevent an arc fault to the enclosure 102, electrical components, test point 108, or other parts for electrical conditions likely within the enclosure 102. One of skill in the art will recognize other configurations of an impedance 112 connected to a test point 108 that limits current to the test point 108.

In one embodiment, the system 100 includes a test conductor 114 connected to a point on a conductor 116 connected to an electrical component (e.g. the first electrical component 104) of the one or more electrical components in the enclosure 102, and to the impedance 112. The test conductor 114 is within the enclosure 102. Typically the test conductor 114 has a rated ampacity sufficient to carry any current from the conductor 116 to the test point 108. In addition, the test conductor 114 may be sized for mechanical strength and convenience. The test conductor 114, in one embodiment, includes a smaller gauge wire that is flexible. In another embodiment, the test conductor 114 includes a bus bar, a circuit trace, or other conductive element. The test conductor 114 is typically capable of transferring electrical current or signals. In one embodiment, the test conductor 114 may have very little resistance. In another embodiment, the test conductor 114 may provide some appreciable impedance in addition to the impedance 112 connected to the test point 108.

In one embodiment, the test conductor 114 is flexible and is arranged to be out of the way when the enclosure 102 is opened. For example, if the test point 108 is mounted in a door of the enclosure 102, the test conductor 114 may be routed near a hinge so that when the door is opened the test conductor 114 is out of the way of accessing the electrical components (e.g. 104, 106) in the enclosure 102. In another embodiment, the test conductor 114 is rigid. For example, the test conductor 114 may be a trace on a circuit board, a bus bar, etc. One of skill in the art will recognize other ways to implement the test conductor 114.

In one embodiment, the conductor 116 is a wire of a conductive material connected between two electrical components in the enclosure 102. For example, the conductor 116 may be connected between the first electrical component 104 and the second electrical component 106. Typically, the conductor 116 is sized to allow a rated current to flow between the first and second components 104, 106. The conductor 116 may be a wire, a bus bar, a circuit trace, or the like. In another embodiment, the conductor 116 may be electrically connected to other electrical components in the enclosure 102. For example, the conductor 116 may be electrically connected to a line side of several circuit breakers. In an embodiment were the conductor 116 is a wire, the wire may be solid or stranded, and may be a variety of gauges as one skilled in the art would recognize. The conductor 116 may carry electrical current or a variety of electrical signals. The electrical components, such as the first and second electrical components 104, 106, may be electrical components commonly found in an electrical enclosure 102, such as a disconnect, a load connection point, a ground, a grounding conductor, a phase conductor, a grounded conductor, a variable frequency drive, an overcurrent protection device, a meter, or the like.

Faults in the enclosure 102, failures in electrical components (e.g. 104,106), short circuits and arc faults may pose a risk to a user, especially when the enclosure 102 is not in a closed state. In addition, the user may come in contact with live electrical components or may cause a fault if the user is working in the enclosure 102 while the enclosure 102 is in an open state. An arc fault is typically a discharge of electricity between two or more components where electrical current continues to flow through air, thus sustaining fault current. An arc fault may occur even though conductors may be insulated. An arc fault may range from a few amps of current, to thousands of amps or more and may pose a significant hazard to a user. The duration of an arc fault may depend on available power and other variables.

In order to enhance safety of a user accessing the enclosure 102, providing a test point 108 for measuring the electrical potential of a conductor 116 within the enclosure 102 may reduce the risks associated with an arc fault or other electrical hazard. For example, a user accessing an enclosure 102 may measure electrical potential of a conductor 116 within the enclosure 102 without opening the enclosure 102. For example, the user may determine that electrical components (e.g. 104, 106) within the enclosure 102 are de-energized prior to opening the enclosure 102. In this example, the test point 108, impedance 112, and test conductor 114 allows a user to externally check electrical potential of the conductor 116 and connected electrical components 104, 106, while the enclosure 102 is in a closed state.

Figure 2:
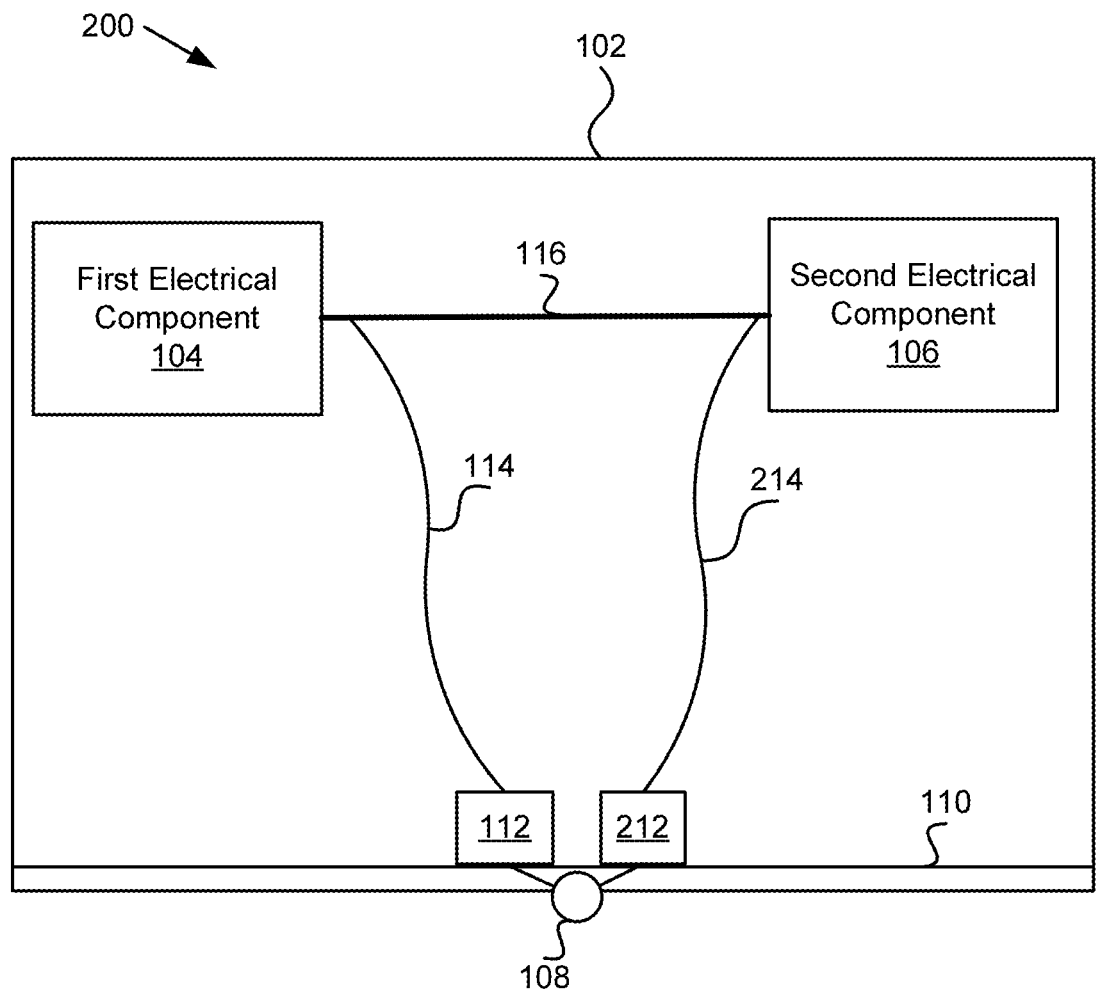
FIG. 2 is a schematic block diagram illustrating another embodiment of an system for verifying an electrically safe working condition.

FIG. 2 is a schematic block diagram illustrating another embodiment of a system 200 for verifying an electrically safe working condition. The system 200 includes an enclosure 102, a first electrical component 104, a second electrical component 106, a test point 108, an impedance 112 ("first impedance"), a test conductor 114 ("first test conductor"), and a conductor 116 connecting the first electrical component 104 and the second electrical component 106, which are substantially similar to those described above in relation to the system 100 of FIG. 1. The system 200 also includes a second impedance 212 and a second test conductor 214, which are described below.

The system 200, in one embodiment, may further include a second impedance 212 and a second test conductor 214, both within the enclosure 102. In the embodiment, the test conductor 114 connects to a first point on the conductor 116 and the second test conductor 214 connects to a second point on the conductor 116. The second impedance 212 connects to the second test conductor 214 and to the test point 108.

In one embodiment, the first point where the first test conductor 114 is connected is a first end of the conductor 116 and the second point where the second test conductor 214 is connected is a second end of the conductor 116. In this example, connecting to the first and second ends of the conductor 116 may provide a more complete coverage of the length of the conductor 116. In another embodiment, the first test conductor 114 connects to the first electrical component 104 and/or the second test conductor 214 connects to second electrical component 106 in such a way that the electrical potential between the first and second test conductors 114, 214 are substantially similar. For instance, if the first electrical component 104 is a disconnect and the second electrical component 106 is a lug for connecting a load, the first test conductor 114 may be connected to a load side of the disconnect and to the lug so electrical potential between the first and second points where the first and second test conductors 114, 214 are connected is substantially similar. In another embodiment, the first test conductor 114 and the second test conductor 214 are connected to the conductor 116 at substantially the same point.

The system 200 includes a second impedance 212 connected to the second test conductor 214 and the test point 108. In one embodiment, the second impedance 212 is substantially similar to the first impedance 112. In another embodiment, the first and second impedances 112, 212 are different. In another embodiment (not shown), a system includes a single impedance 112 as shown in the system 100 of FIG. 1 connected to both a first test conductor 114 and a second test conductor 214. In one embodiment, the first and second impedances 112, 212 are located together, for example on a substrate or printed circuit board. In another embodiment, the first and second impedances 112, 212 are separate. In another embodiment, the first and second impedances 112, 212, along with the first and second test conductors 114, 214 are arranged to reduce arc faults. For example, the first and second impedances 112, 212 and the first and second test conductors 114, 214 may be separated from each other and other electrical components (e.g. 104, 106) and the enclosure 102 by an amount such that a chance of arc faults are reduced based on expected voltages in the enclosure 102. In another embodiment, the first and second impedances 112, 212 and the first and second test conductors 114, 214 may be encapsulated by a material to reduce a chance of an arc fault. One of skill in the art will recognize other impedances and arrangements of impedances and test conductors.

In the apparatus 200, advantageously a single failure of the first test conductor 114, the first test impedance 112, the second test conductor 214, or second impedance 212 may still allow a user to measure electrical potential of the conductor 116 and attached first and second electrical components 104, 106 via the test point 108 as previously described. In another embodiment, having the first test conductor 114 and the second test conductor 214 connected to the conductor 116 at two distinct points, such as at a first end and a second end of the conductor 116 may provide added fault tolerance. For example, first test conductor 114 may be connected to the conductor 116 at a first point that is one end of the conductor 116, and the second test conductor 214 may be connected to a second point on the conductor 116 that is another end of the conductor 116 and a break in the conductor 116 between connection points of the first and second test conductors 114, 214 may allow voltage present on the first or second electrical components 104, 106 to be detected. In this example, having more of the conductor 116 between connection points to the first and second test conductors 114, 214 may provide greater fault tolerance than where the first and second test conductors 114, 214 are connected to the conductor 116 close together.

In another embodiment, the test point 108 may be connected to more than two impedances and test conductors. For example, if the conductor 116 is a bus bar on a line side of multiple disconnects, a test conductor (e.g. 114) may attach to a line connection lug and to a line side of each disconnect attached to the conductor 116. In the embodiment, each test conductor 114, 214 may also connect to an impedance connected to the test point 108. In another embodiment, two or more test conductors 114, 214 may connect to an impedance connected to the test point 108. Having more than one impedance (e.g. 112, 212) may be more fault tolerant than one impedance 112. One of skill in the art will recognize other configurations of test conductors (e.g. 114, 214) and impedances (e.g. 112, 212) connected to a conductor 116.

Figure 3:
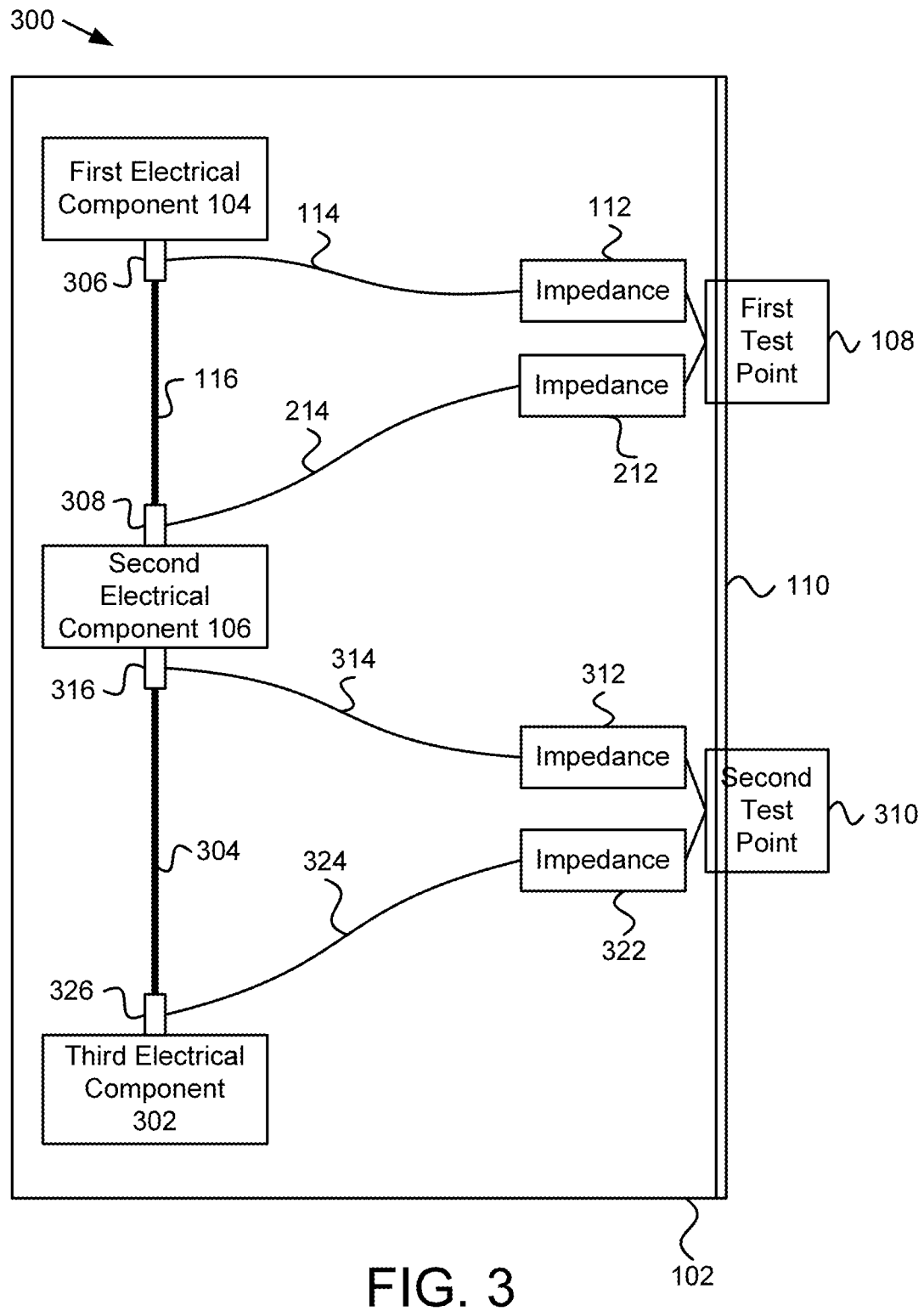
FIG. 3 is a schematic block diagram illustrating one embodiment of an enclosure with a system for verifying an electrically safe working condition.

FIG. 3 is a schematic block diagram illustrating one embodiment of an enclosure with a system 300 for verifying an electrically safe working condition. The system 300 includes an enclosure 102, a first electrical component 104, a second electrical component 106, a test point ("first test point") 108 at a boundary 110 of the enclosure 102, a first impedance 112, a first test conductor 114, a conductor ("first conductor") 116, a second impedance 212 and a second test conductor 214, which are substantially similar to those described above in relation to the systems 100, 200 of FIGS. 1 and 2. The system 300 also includes a third electrical component 302, a second conductor 304, a first connector 306, a second connector 308, a second test point 310, a third impedance 312, a third test conductor 314, a third connector 316, a fourth impedance 322, a fourth test conductor 324, and a fourth connector 326, which are discussed below.

In one embodiment, the system 300 includes a third electrical component 302 connected to the second electrical component 106 via a second conductor 304. For example, the first electrical component 104 may be a connection point for incoming power conductors, the second electrical component 106 may be a disconnect of some type, and the third electrical component 302 may be a load connection point. In another embodiment, the third electrical component 302 may be connected to a different electrical component through the second conductor 304. In other embodiments, the system 300 may include test points, impedances, test conductors, etc. for each phase of a single- or three-phase power system. In other embodiments, the system 300 may include a test point for each conductor where testing may be desirable. The third electrical component 302 may be a disconnect, a circuit breaker, a drive, a meter, a connection point or other electrical component typically found in an electrical enclosure 102.

In one embodiment, the system 300 includes second conductor 304 connecting electrical components, such as the second and third electrical components 106, 302. Typically the second conductor 304, like the first conductor 116, allows transmission of electrical power. In another embodiment, the second conductor 304 transmits a signal, such as a signal to a meter or to an external device. The system 300, in one embodiment, includes a second test point 310. In one example, the second test point 310 is substantially similar to the first test point 108, and may meet the Ingression Protection rating of IP20. In another example, the second test point 310 is configured differently than the first test point 108. For instance, the second test point 310 may be configured with a different impedance 312, 322 than the first and second impedances 112, 212 for a different measurement, such as measuring current. In one embodiment, the first and second test points 108, 310 are grouped together and may have a common cover or separate covers. For example, the system 300 may include a group of three test points for three-phase conductors. In another embodiment, the first and second test points 108, 310 are separate. In another embodiment, the first test point 108 and second test point 310 are isolated from each other by a physical barrier.

In one embodiment, the system 300 includes at least a third impedance 312 connected to the second test point 310 and to a third test conductor 314. The third test conductor 314 may be connected to the second conductor 304 as illustrated or to another conductor. The third impedance 312 and second test point 310 are configured to provide a different measurement at the second test point 310 than a measurement at the first test point 108. In another embodiment, the second test point 310 is connected to a fourth impedance 322, which is connected to a fourth test conductor 324, and the fourth test conductor 324 is connected to be substantially similar electrically to where the third test conductor 314 is connected, such as to the second conductor 304. As with the first test point 108, having multiple impedances 312, 322 and test conductors 314, 324 for the second test point 310 may increase reliability of the second test point 310 such that the second test point 310 may be single fault tolerant. The second test point 310 may also have additional impedances and test conductors as described above. In one embodiment, the third and fourth impedances 312, 322 and third and fourth test conductors 314, 324, along with the first and second impedances 112, 212 and first and second test conductors 114, 214 are within the enclosure 102.

The third and fourth impedances 312, 322 and third and fourth test conductors 314, 324 may be configured similar to the first and second impedances 112, 212 and first and second test conductors 114, 214. In one embodiment, the impedances 112, 212, 312, 322 are configured to limit current through the first test point 108 and the second test point 310 to a low value. Typically, limiting current to a low level improves safety such that users accessing the panel are less likely to be injured. Typically tingle sensation occurs at about 0.25 milliamperes ("mA") to 0.5 mA for an adult female and between 0.5 mA to 1 mA for an adult male. For example, the impedances 112, 212, 312, 322 may limit current to the first and second test points 108, 310 to 0.5 mA, or to another value below where most people experience a tingle sensation.

In another embodiment, the impedances 112, 212, 312, 322 may limit current to the first and second test points 108, 310 to a higher level, such as in an uncomfortable sensation level of about 1 mA to 2 mA, or below a maximum let-go level of about 9 mA for an adult female or about 15 mA for an adult male. In another embodiment, the impedances 112, 212, 312, 322 may limit current to the first and second test points 108, 310 to a value lower than 0.25 mA. The impedances 112, 212, 312, 322 are typically sized to allow a voltage reading on the test points 108, 310 but also to prevent current at an unsafe level. For example, the impedances 112, 212, 312, 322 may be sized based on maximum expected voltages within the enclosure 102 while allowing measurement and limiting current to safe levels. One of skill in the art will recognize other ways to size the impedances 112, 212, 312, 322 for safety and functionality. In one embodiment, the enclosure 102 with the test points 108, 310 has an Ingress Protection Rating of 20, has an HRC 0 rating before and during access of the test points 108, 310, and has impedances 112, 212, 312, 322 configured to limit current through the test points 108, 310 to below a maximum let-go level. In one embodiment, if one of the impedances 112, 212, 312, 322 shorts, the current through the test points 108, 310 remains below the maximum let-go level.

The system 300 includes a first connector 306, a second connector 308 connecting the first test conductor 114 to the first conductor 116 and the second test conductor 214 to the first conductor 116 as shown in FIG. 3. Similarly, the system 300 includes a third connector 316 and a fourth connector 326 connecting the third test conductor 314 to the second conductor 304 and the fourth test conductor 324 to the second conductor 304 as shown in FIG. 3. The connectors 306, 308, 316, 326, in one embodiment, are designed to allow a test conductor (e.g. 114, 214, 314, 324) to connect to a conductor (e.g. 116, 304). In another embodiment, the connectors 306, 308, 316, 326 are connected by soldering, crimping, sharing a lug, or other method known to those of skill in the art. Typically, the connectors 306, 308, 316, 326 are connected with a low impedance and a physically secure connection.

The system 300 with multiple test points (e.g. 108, 310 and possibly more) may be useful to test relevant electrical points within the enclosure prior to opening the enclosure 102. For example, if the second electrical component 106 is a disconnect, measurement of voltage potential from the first test point 108 to the second test point 310 may allow a user to determine if the disconnect is open. For instance, if a voltage measurement between the first and second test points 108, 310 is near zero voltage, the measurement may indicate that the disconnect is closed. If a voltage measurement between the first and second test points 108, 310 is significantly higher than zero, the measurement may indicate that the disconnect is open. Multiple test points may allow multiple voltage measurements, such as line-to-line, line-to-neutral, line-to-ground, neutral-to-ground, etc. Other voltage and current measurements are also possible based on configurations of the impedances (e.g. 112, 212, 312, 322, and possibly others) and test conductors (e.g. 114, 214, 314, 324).

The system 300 with test points (e.g. 108, 310 and possibly more) may allow the enclosure 102 to be locked-out and/or tagged-out with a hazard risk category ("HRC") 0 protection per 2012 NFPA standard 70E. For example, the test points (e.g. 108, 310, etc.) may allow a user to verify that circuit breakers, disconnects, fuses, etc. are de-energized, that a load, such as a motor, is not feeding voltage back to the enclosure 102, etc. so that lock-out/tag-out procedures can be performed prior to opening the enclosure 102. One of skill in the art will recognize other ways that test points (e.g. 108, 310) can be used to verify safe conditions before opening an enclosure 102.

Figure 4:
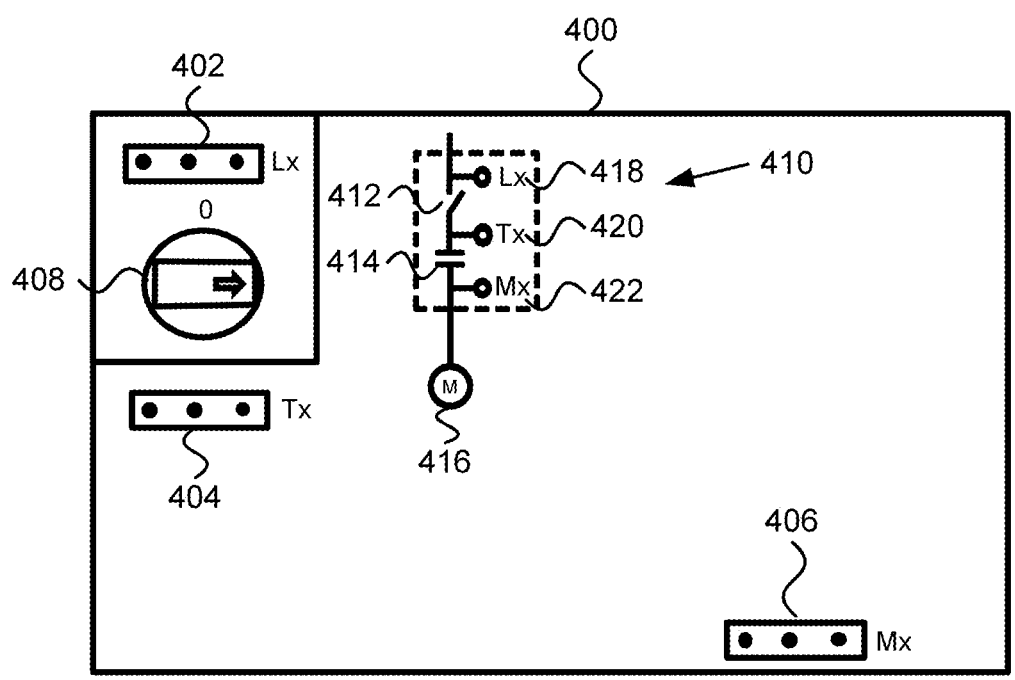
FIG. 4 is a schematic block diagram illustrating one embodiment of an enclosure including an apparatus for verifying electrically safe working conditions.

FIG. 4 is a schematic block diagram illustrating one embodiment of an enclosure 400 including an apparatus for verifying electrically safe working conditions. The enclosure 400 includes, in one embodiment, multiple test point groups 402, 404, 406. For example, a test point group (e.g. 402) may include a test point for each phase of a three-phase system. The enclosure 400 may also include a disconnect 408 and a starter (not shown). The enclosure 400 may also include a one-line diagram 410 that corresponds with the electrical components and wiring within the enclosure 400.

In one embodiment, the enclosure 400 is substantially similar to the enclosure 102 of the systems 100, 200, 300 of FIGS. 1-3. For example, the enclosure 400 includes electrical components, such and the disconnect 408 and motor starter. The enclosure 400 may have other electrical components as well, such as lugs to land incoming power conductors and to land wiring to a motor. The enclosure 400 may be steel, may have a cover or door, etc. as described in relation to the enclosures 102 described above.

The enclosure 400 includes test point groups 402, 404, 406 and, in one embodiment, each test point group (e.g. 402) includes three test points, which are substantially similar to the test points 108, 310 described above in relation to the systems 100, 200, 300 of FIGS. 1-3, and may connect to conductors for the three-phases of the power system feeding the enclosure 400. A one-line diagram is typically a simplified wiring diagram where a single line represents multiple phases of a multi-phase power system. The one-line diagram 410 indicates that there is a disconnect 412, represented by a switch symbol, connected to a motor starter 414, represented by a contactor symbol, connected to a motor 416.

A conductor, which would typically come from a power source, is connected to a supply side of the disconnect 412 and is connected to the first test point group 402. The one-line diagram 410 displays the first test point group as a line to a circle and labeled "Lx" 418 that corresponds to the first test point group 402. The one-line diagram 410 displays a conductor connecting the disconnect 412 to the starter 414 and a test point group as a line and a circle labeled "Tx" 420, that corresponds to the second test point group 404. The one-line diagram 410 displays a conductor connected to the motor 416 and a third test point group as a line and a circle labeled "Mx" 422, that corresponds to the third test point group 406. Conductors from lugs for incoming power (not shown) to the disconnect 408, conductors between the disconnect 408 and starter, and conductors between the starter and lugs for connecting a motor (not shown), in one embodiment, are substantially similar to the first and second conductors 116, 304 described above in relation to the systems 100, 200, 300 of FIGS. 1-3. The conductors in the enclosure 400 may include at least one test conductor (e.g. 114) and an impedance (e.g. 112) connected to a test point (e.g. 108) on the test point groups 402, 404, 406. In another embodiment, the conductors in the enclosure 400 include at least two test conductors (e.g. 114, 214) and two impedances (e.g. 112, 212) connected to each test point (e.g. 108) on the test point groups 402, 404, 406.

A user that wants to test line-to-line voltage on the supply side of the disconnect 408 may probe two test points on the first test point group 402. A user that wants to test voltage across the disconnect 408 for a phase may probe a test point of the first test point group 402 and the corresponding test point on the second test point group 404. A user that wants to test voltage across the starter for a phase may probe a test point of the second test point group 404 and the corresponding test point on the third test point group 406. A user may also want to test voltage to ground and may probe a test point in the test point groups 402, 404, 406 and a grounded point, such as the enclosure 102. In one embodiment, the enclosure 400 includes a test point that is connected to ground. In one example, the test point connected to ground may include a test conductor and an impedance. In another example, the test point connected to ground may include a test conductor but may not include an impedance. One of skill in the art will recognize other test possible test points for electrical components in the enclosure 400 and other configurations of test points and electrical components, and other measurements.

Figure 5:
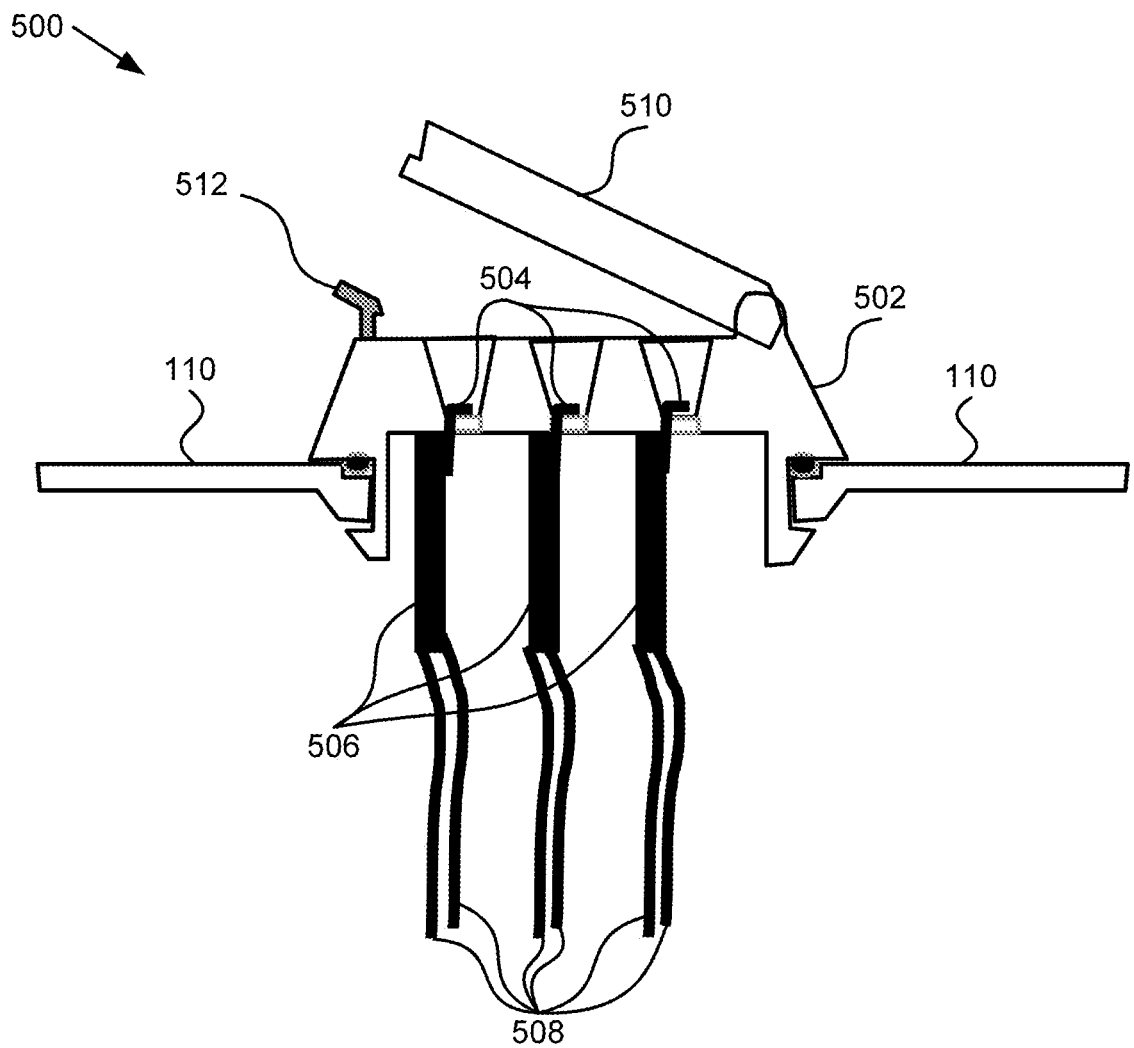
FIG. 5 is a schematic diagram illustrating a section view of one embodiment of a test point group for housing multiple test points.

FIG. 5 is a schematic diagram illustrating a section view of one embodiment of a test point group 500 for housing multiple test points. The test point group 500 includes a housing 502 mounted in the boundary 110 of an enclosure 102 where the housing 502 includes three test points 504, corresponding impedances 506 and test conductors 508, a cover 510, and a cover latch 512, which are described below.

The test point group 500, in one embodiment, is mounted in a boundary 110 of the enclosure 102, such as a cabinet door, a cover, a wall, etc. In another embodiment, the test point group 500 is mounted interior to the boundary 110, such as in a cover behind a door of the enclosure 102. For example, the housing 502 of the test point group 500 may be mounted in a cover that surrounds circuit breakers in an electrical distribution panel where the circuit breakers are covered by a door. The test points 504, impedances 506, test conductors 508, enclosure 102, etc., in one embodiment, are substantially similar to those described above in relation to the systems 100, 200, 300 and enclosure 400 of FIGS. 1-4.

The test points 504, in the embodiment, are accessible by opening the cover 510 and probing in the recesses of the housing 502. As illustrated, in one embodiment the test points 504 are isolated by a physical barrier between the test points 504 and have a small portion of a conductive material exposed once the cover 510 is open. A remainder of each of the test points 504 extends into the housing 502 to the impedances 506. The impedances 506 are shown as one element for convenience, but it is understood that each test conductor 508 may connect to one or more impedances so that each of the two test conductors 508 for a particular test point connect to separate impedances, for example on a printed circuit board. Two test conductors 508 corresponding to a test point 504 connect to two points on a conductor (e.g. 116, 304). In the depicted embodiment, the test points 504 of the test point group 500 are covered by a single moveable cover that latches shut with the cover latch 512. One of skill in the art will recognize that each test point 504 may include a separate moveable cover. A user may open the cover 510 to access the test points 504. In one embodiment, the movable cover 510 to expose the test point does not alter the Ingress Protection code rating of the test point 504 and/or the enclosure 102. In another embodiment, the test point group 500 does not include a cover 510 or cover latch 512.

Figure 6:
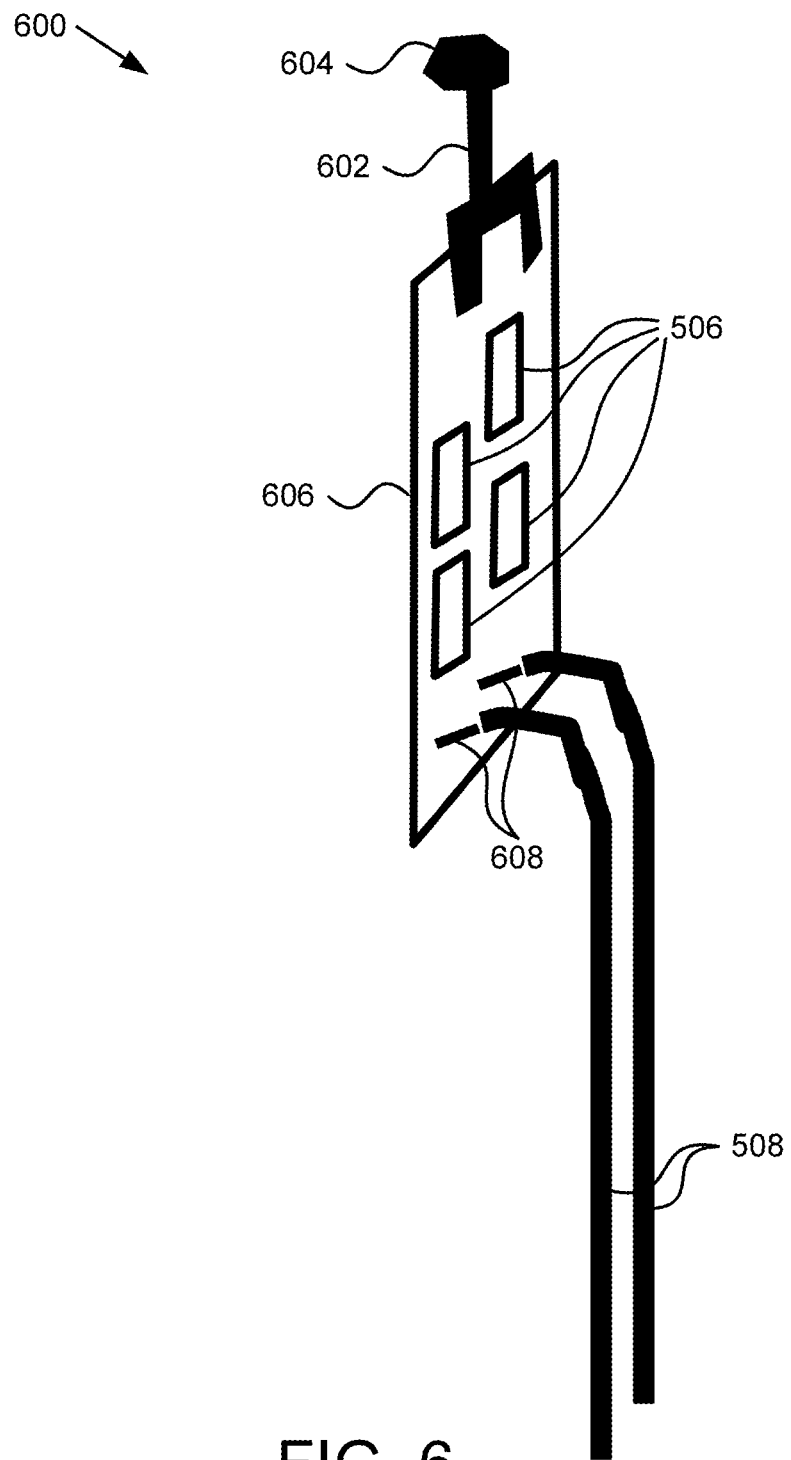
FIG. 6 is a schematic diagram illustrating one embodiment of an apparatus of a test point.

FIG. 6 is a schematic diagram illustrating one embodiment of an apparatus of a test point 600. The test point 600 may include a conductive element 602 with a contact portion 604, impedances 506 on a printed circuit board ("PCB") 606, and test conductors 508 connected 608 to the PCB, which are described below.

The test point 600 may be substantially similar to a test point (e.g. 108, 310) describe above in relation to the systems 100, 200, 300 and enclosure 400 of FIGS. 1-4 and may be a more detailed view of a test point 504 of the test point group 500 of FIG. 5. In one example, the test point 600 includes a conductive element 602 with a contact portion 604. The contact portion 604 may be a portion of the conductive element 602 that is exposed in the housing 502 when a cover 510 is open. The conductive element 602 may be a wire, a circuit trace, a piece of copper sheeting that is stamped and shaped, or the like. For example, where the conductive element 602 is a piece of a sheet of copper, the conductive element 602 may be stamped and cut to have a portion connect to a circuit trace on the PCB 606 and a portion shaped to fill a bottom of a recess in the housing 502.

The impedances 506 may be attached to the PCB 606 where circuit traces (not shown) connect the conductive element 602 to corresponding impedances 506 and to a test conductor 508. In the depicted embodiment, two impedances 506 may be connected together in series and then to the conductive element 602 and to a single test conductor 508. Other embodiments may exclude the PCB 606 and may have leads to the impedances 506 connected together and to the conductive element 602 and to a test conductor 508, such as by soldering. A test point 600 may be constructed as shown and inserted into a housing 502 and the contact portion 604 may be bent to fill the bottom of a recess in the housing 502.

In one embodiment, the test point 600 is encapsulated by a material. For example, a non-conductive material may be formed around the impedances 506, PCB 606, connections 608 to the test conductors 508, and at least a portion of the conductive element 602. For instance, the non-conductive material may leave the contact portion 604 exposed. In one embodiment, the test point 600 is encapsulated before insertion into a housing 502. In another embodiment, one or more test points 600 are inserted into a housing 502 prior to encapsulation. In one embodiment, the material reduces arc-fault potential of the apparatus to meet the HRC 0 protection of NFPA standard 70E. For example, the impedances 506, the connections 608 to the test conductors 508, the PCB 606, etc. may be spaced with the encapsulation material in mind such that when one or more test point 600 are encapsulated, the apparatus reduces arc-flash potential allowing the apparatus to meet the HRC 0 protection of NFPA 70E. The material may be chosen to prevent touching of components, tracing, etc. and may be selected to reduce arc-flash potential to be less than if air surrounded the test point. One of skill in the art will recognize other ways to construct a test point 600.

Figure 7A:
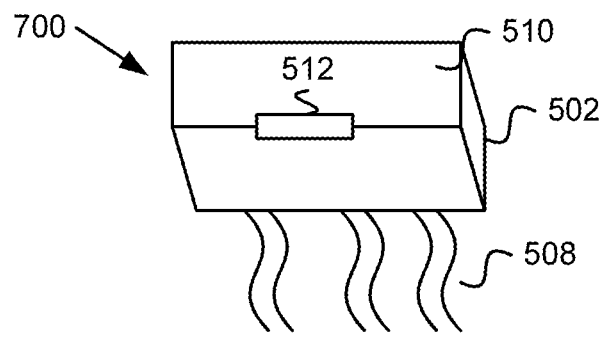
FIG. 7A is an illustration showing one embodiment of an apparatus for housing multiple test points in a closed state.
Figure 7B:
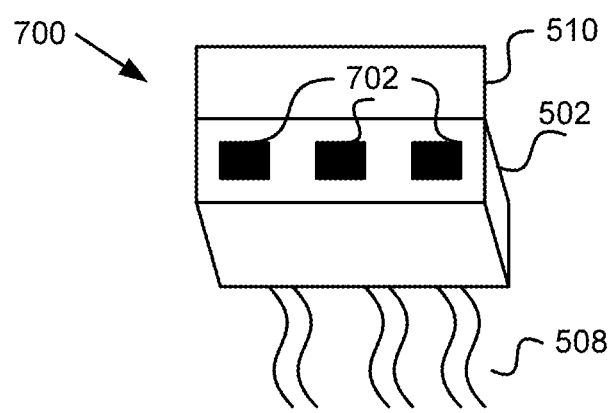
FIG. 7B is an illustration showing one embodiment of the apparatus for housing test points in an open state.
Figure 7C:
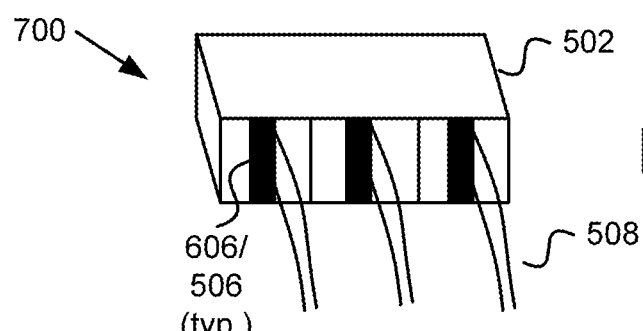
FIG. 7C is an illustration showing a back side of the apparatus for housing test points.
Figure 7D:
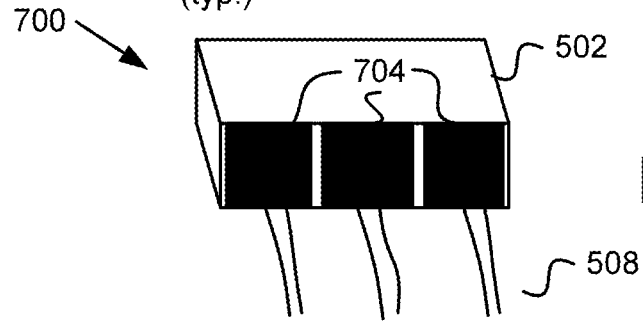
FIG. 7D is an illustration showing the back side of the apparatus for housing test points where the test points are encapsulated.

FIG. 7A is an illustration showing one embodiment of an apparatus 700 for housing multiple test points 600 in a closed state. The apparatus 700 may be a test point group 500 as shown in FIG. 5 with test points 600 as shown in FIG. 6. The apparatus 700 may include a housing 502 with a cover 510 in a closed state with a cover latch 512 holding the cover 510 closed, and test conductors 508 extending from the back of the housing 502. FIG. 7B is an illustration showing the apparatus 700 for housing test points 600 in an open state. The apparatus 700 includes the housing 502 with the cover 510 that is open, exposing recesses 702. At the bottom of each recess 702 is the contact portion 604 of the conductive element 602 (not shown) of the test points 600. FIG. 7C is an illustration showing a back side of the apparatus 700 for housing test points 600. The apparatus 700 is a back view of the housing 502 showing the PCB 606/impedances 506 prior to encapsulation. FIG. 7D is an illustration showing the back side of the apparatus 700 for housing test points 600 where the test points 600 are encapsulated. The view is similar to that of FIG. 7C, but the PCB 606, impedances 506, a portion of the conductive element 602, and connection 608 of the test conductors 508 are encapsulated with a material 704.

Figure 8:
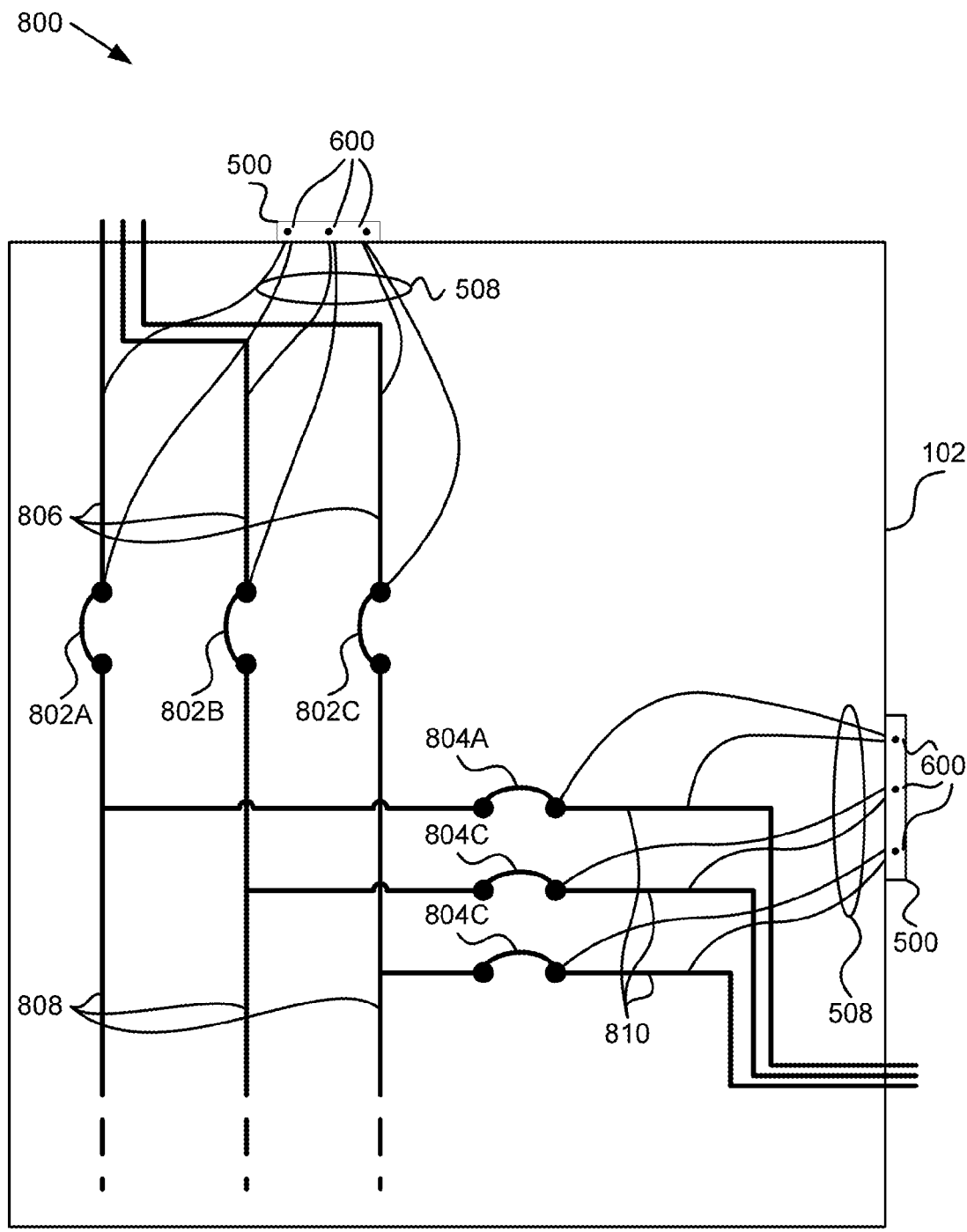
FIG. 8 is a schematic diagram illustrating one embodiment of a system for verifying electrically safe working conditions.

FIG. 8 is a schematic diagram illustrating one embodiment of a system 800 for verifying electrically safe working conditions. The system 800, in one embodiment, includes an enclosure 102 two test point groups 500, each with three test points 600 and associated test conductors 508, which are substantially similar to those described above. The test point groups 500 are shown on two sides of the enclosure 102 for convenience. One of skill in the art will recognize locations suitable for mounting the test point groups 500. The system 800 may be an electrical panel with electrical components that are circuit breakers. A first set of circuit breakers 802A, 802B, 802C (collectively 802) connect incoming conductors 806 to bus bars 808 within the electrical panel. A branch circuit overcurrent protection circuit breaker for each phase 804A, 804B, 804C (collectively 804) may connect to the bus bars 808 to conductors 810 for connecting a load.

The test conductors 508, in one embodiment, connect to the conductors 806, 810 at two locations. For example, the test conductors 508 may connect to the circuit breakers 802, 804 and to lugs (not shown) where conductors from a power source feeding the panel and conductors to the load are connected. In another embodiment, a test point group 500 (not shown) is included and connects to the bus bars 808 with two or more test conductors 508. One of skill in the art will recognize other configurations of test point groups 500 with test points 600 for an enclosure 102, such as an electrical panel, motor control center, disconnect enclosure, etc.

The described examples and embodiments are to be considered in all respects only as illustrative and not restrictive. This written description uses examples and embodiments to disclose the invention, including best mode, and also to enable any person skilled in the art to practice the invention, including making and using any devices or systems and performing any incorporated methods. The examples and embodiments may be practiced in other specific forms. The patentable scope of this invention is defined by the claims and may include other examples that occur to those skilled in the art. Such other examples are intended to be within the claims if they have structural elements that do not differ from the literal language of the claims, or if they include equivalent structural element with insubstantial differences from the literal languages of the claims.

What is claimed is:

1. An apparatus comprising: a test point accessible from an exterior of an enclosure while the enclosure is in a closed state, the enclosure housing one or more electrical components, the closed state preventing a user from touching the one or more electrical components; a first test conductor connected to a first point on a conductor connected to an electrical component of the one or more electrical components, the first test conductor within the enclosure; a first impedance connecting the test point to the first test conductor, the first impedance within the enclosure, wherein the first impedance is configured to limit current to the test point and comprises one or more resistors; a second test conductor connected to a second point on the conductor, the second test conductor within the enclosure; and a second impedance connecting the test point to the second test conductor, the second impedance within the enclosure, wherein the second impedance is configured to limit current to the test point and comprises one or more resistors, wherein the test point meets an Ingress Protection code rating of 20.

2. The apparatus of claim 1, wherein the first point on the conductor comprises a first end of the conductor and the second point on the conductor comprises a second end of the conductor.

3. The apparatus of claim 1, wherein the test point comprises a first test point, the electrical component comprises a first electrical component, and the conductor connected to the electrical component comprises a first conductor and further comprising: a second test point accessible from the exterior of the enclosure while the enclosure is in a closed state; a third test conductor connected to a first point on a second conductor connected to a second electrical component; a third impedance connecting the second test point to the third test conductor, the third impedance within the enclosure, wherein the third impedance is configured to limit current to the test point and comprises one or more resistors; a fourth test conductor connected to a second point on the second conductor; and a fourth impedance connecting the second test point to the fourth test conductor, the fourth impedance within the enclosure, wherein the fourth impedance is configured to limit current to the test point and comprises one or more resistors.

4. The apparatus of claim 3, wherein a first voltage measurement measured between one of the first point on the first conductor and the second point on the first conductor and one of the first point on the second conductor and the second point on the second conductor is substantially similar to a second voltage measurement measured between the first test point and the second test point.

5. The apparatus of claim 3, wherein the first and second test points are isolated from each other by a physical barrier.

6. The apparatus of claim 3, wherein the first electrical component and second electrical component are a single electrical component and the first conductor and second conductor are connected to the single electrical component.

7. The apparatus of claim 1, further comprising a movable cover that covers the test point.

8. The apparatus of claim 7, wherein the movable cover is attached to the enclosure.

9. The apparatus of claim 8, wherein moving the movable cover to expose the test point does not alter the Ingress Protection code rating of the test point.

10. The apparatus of claim 1, wherein the enclosure with the test point has a hazard risk category ("HRC") rating of 0 prior to accessing the test point and while the test point is accessed.

11. The apparatus of claim 10, wherein the impedance is configured to limit current through the first test point to below a maximum let-go level.

12. The apparatus of claim 1, wherein the electrical component comprises one or more of a disconnect, a load connection point, a ground, a grounding conductor, a phase conductor, and a grounded conductor.

13. The apparatus of claim 1, wherein the enclosure may be one or more of locked-out and tagged-out with a hazard risk category ("HRC") 0 protection per 2012 National Fire Protection Association ("NFPA") standard 70E.

14. The apparatus of claim 1, wherein at least:
the impedance;
a connection between the impedance and the test conductor; and
areas of the test point surrounding a location on the test point accessed for testing are encapsulated by a material.

15. The apparatus of claim 14, wherein the material reduces arc-fault potential of the apparatus to meet the HRC 0 protection of NFPA standard 70E.

16. A system comprising: an enclosure; one or more electrical components housed in the enclosure; a test point accessible from an exterior of the enclosure while the enclosure is in a closed state, the closed state preventing a user from touching the electrical components; a first test conductor connected to a first point on a conductor connected to an electrical component of the one or more electrical components, the first test conductor within the enclosure; a first impedance connecting the test point to the first test conductor, the first impedance within the enclosure, wherein the first impedance is configured to limit current to the test point and comprises one or more resistors; a second test conductor connected to a second point on the conductor, the second test conductor within the enclosure; and a second impedance connecting the test point to the second test conductor, the second impedance within the enclosure, wherein the second impedance is configured to limit current to the test point and comprises one or more resistors, wherein the test point meets an Ingress Protection code rating of 20.

17. The system of claim 16, wherein the test point comprises a first test point, the electrical component comprises a first electrical component, and the conductor connected to the electrical component comprises a first conductor and further comprising: a second test point accessible from the exterior of the enclosure while the enclosure is in a closed state; a third test conductor connected to a first point on a second conductor, the second conductor connected to a second electrical component; a third impedance connecting the second test point to the third test conductor, the third impedance within the enclosure, wherein the third impedance is configured to limit current to the test point and comprises one or more resistors; a fourth test conductor connected to a second point on the second conductor; and a fourth impedance connecting the second test point to the fourth test conductor, the fourth impedance within the enclosure, wherein the fourth impedance is configured to limit current to the test point and comprises one or more resistors, wherein the second test point meets an Ingress Protection code rating of 20.

18. The system of claim 16, further comprising a cover for exposing the test point, The cover having an open state and a closed state, the cover being attached to the enclosre, wherein the cover, when in the open state, provides access to the test point, and, when in the closed state, increases the Ingress Protection code rating of the enclosure to 40.

19. An apparatus comprising:
  two or more test points accessible from an exterior of an enclosure while the enclosure is in a closed state, the enclosure housing one or more electrical components, the closed state preventing a user from touching the electrical components, an electrical component of the one or more electrical components comprising one or more of an overcurrent protection device, a disconnect, a motor controller, a load connection point, a ground, a grounding conductor, a phase conductor, and a grounded conductor, each test point comprising
    a cover providing access to at least the test point when the cover is in an open state and covering the test point in a closed state, each test point electrically isolated from another test point by a physical barrier;
    a first impedance connected to the test point, wherein the first impedance is configured to limit current to the test point and comprises one or more resistors;
    a first test conductor connected to the first impedance and to a first end of a conductor, the conductor connected to an electrical component of the one or more electrical components housed within the enclosure, the conductor and the first test conductor within the enclosure;
    a second impedance connected to the test point, wherein second the impedance is configured to limit current to the test point and comprises one or more resistors; and
    a second test conductor connected to the second impedance and to a second end of the conductor, the second test conductor and second impedance within the enclosure,
  wherein at least
    the first impedance;
    the first test conductor;
    the second impedance;
    the second test conductor; and
    areas of the test point surrounding a location on the test point accessed for testing
  are encased by a material, the material reducing arc-fault potential of the apparatus to allow access to the test point with HRC 0 protection per NFPA standard 70E,
  wherein the test point meets an Ingress Protection code rating of 20.

* * * * *